(12) United States Patent
Lim

(10) Patent No.: US 7,952,906 B2
(45) Date of Patent: May 31, 2011

(54) INFORMATION STORAGE DEVICES USING MAGNETIC DOMAIN WALL MOVEMENT AND METHODS OF MANUFACTURING THE SAME

(75) Inventor: Chee-kheng Lim, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 380 days.

(21) Appl. No.: 11/980,455

(22) Filed: Oct. 31, 2007

(65) Prior Publication Data

US 2008/0152954 A1 Jun. 26, 2008

(30) Foreign Application Priority Data

Dec. 22, 2006 (KR) .................. 10-2006-0133095
Dec. 29, 2006 (KR) .................. 10-2006-0138862
Dec. 29, 2006 (KR) .................. 10-2006-0138866

(51) Int. Cl.
*G11C 19/00* (2006.01)

(52) U.S. Cl. ............ 365/81; 365/87; 365/130; 365/158; 365/173; 365/225.5; 977/933

(58) Field of Classification Search .............. 365/48, 365/55, 62, 66, 74, 78, 80–93, 100, 130, 365/131, 148, 158, 171–173, 225.5, 243.5; 216/22; 257/421, E21.665; 438/3; 977/933–935
See application file for complete search history.

(56) References Cited

U.S. PATENT DOCUMENTS

| | | | |
|---|---|---|---|
| 5,815,342 A | 9/1998 | Akiyama et al. | |
| 5,870,328 A | 2/1999 | Mohri | |
| 6,566,872 B1 | 5/2003 | Sugitani | |
| 6,713,195 B2 | 3/2004 | Wang et al. | |
| 6,834,005 B1 * | 12/2004 | Parkin | 365/80 |
| 6,864,042 B1 * | 3/2005 | Kuo et al. | 430/320 |
| 6,920,062 B2 | 7/2005 | Parkin | |
| 7,031,178 B2 * | 4/2006 | Parkin | 365/80 |
| 7,236,386 B2 * | 6/2007 | Parkin | 365/80 |
| 7,586,781 B2 | 9/2009 | Saitoh et al. | |
| 2004/0134565 A1 | 7/2004 | Sun et al. | |
| 2004/0251232 A1 | 12/2004 | Chen et al. | |

(Continued)

FOREIGN PATENT DOCUMENTS

GB 1 497 653 1/1978

(Continued)

OTHER PUBLICATIONS

Chinese Office Action dated Nov. 27, 2009 and English translation thereof.

(Continued)

*Primary Examiner* — Richard Elms
*Assistant Examiner* — Harry W Byrne
(74) *Attorney, Agent, or Firm* — Harness, Dickey & Pierce, P.L.C.

(57) ABSTRACT

An information storage device includes a writing magnetic layer including a magnetic domain wall. An information storing magnetic layer is connected to the writing magnetic layer, and includes at least one magnetic domain wall. The information storage device also includes a reader for reading data recorded in the information storing magnetic layer. The connection layer includes a first portion with a first width adjacent to the writing magnetic layer and a second portion with a second width adjacent to the at least one information storing magnetic layer. The first width is less than the second width.

16 Claims, 11 Drawing Sheets

U.S. PATENT DOCUMENTS

| | | | |
|---|---|---|---|
| 2004/0252538 | A1 | 12/2004 | Parkin |
| 2004/0252539 | A1* | 12/2004 | Parkin .......................... 365/80 |
| 2005/0041463 | A1* | 2/2005 | Drewes ...................... 365/158 |
| 2005/0078509 | A1* | 4/2005 | Parkin ........................ 365/158 |
| 2005/0078511 | A1* | 4/2005 | Parkin ........................ 365/171 |
| 2005/0174876 | A1 | 8/2005 | Katoh |
| 2005/0220990 | A1 | 10/2005 | Aoyama et al. |
| 2006/0024529 | A1 | 2/2006 | Murakam |
| 2006/0104110 | A1* | 5/2006 | Sun et al. .................... 365/173 |
| 2006/0120132 | A1* | 6/2006 | Parkin .......................... 365/80 |
| 2006/0237808 | A1 | 10/2006 | Saito |
| 2007/0254188 | A1 | 11/2007 | Hayakawa et al. |
| 2008/0075978 | A1 | 3/2008 | Weller et al. |
| 2008/0130355 | A1 | 6/2008 | Saitoh et al. |

FOREIGN PATENT DOCUMENTS

| | | |
|---|---|---|
| WO | WO 2004/077451 | 9/2004 |

OTHER PUBLICATIONS

European Search Report (dated Feb. 26, 2008) for counterpart European Patent Application No. 07123052.8-1233 is provided for the purposes of certification under 37 C.F.R. §§ 1.97(e) and 1.704(d).

Fassbender, J. et al., "Magnetic patterning by means of ion irradiation and implantation," Journal of Magnetism and Magnetic Materials, Elsevier Science Publishers, Amsterdam, NL, vol. 320, No. 3-4, Oct. 25, 2007, pp. 579-596.

Fassbender, J., et al., "Topical Review; Tailoring magnetism by light-ion irradiation; Topical Review" Journal of Physics D. Applied Physics, Institute of Physics Publishing, Bristol, GB, vol. 37, No. 16, Aug. 21, 2004, pp. R179-R196.

Owen, N. et al., "Patterning Magnetic Antidot-Type Arrays by $Ga^+$ Implantation," IEEE Transactions on Magnetics, IEEE Service Center, New York, NY, vol. 38, No. 5, Sep. 2002, pp. 2553-2555.

Terris, B., et al., "Topical Review; Nanofabricated and self-assembled magnetic structures as data storage media; Topical Review" Journal of Physics D. Applied Physics, Institute of Physics Publishing, Bristol, GB, vol. 38, No. 12, Jun. 21, 2005, pp. R199-R222.

Chinese Office Action dated Sep. 8, 2010 and English translation thereof.

U.S. Office Action for U.S. Appl. No. 11/980,353 dated Apr. 14, 2010.

Notice of Allowance for U.S. Appl. No. 11/980,353 dated Oct. 15, 2010.

U.S. Office Action for U.S. Appl. No. 11/980,553 dated Aug. 3, 2010.

U.S. Office Action for U.S. Appl. No. 11/980,425 dated Mar. 30, 2010.

U.S. Office Action for U.S. Appl. No. 11/980,425 dated Sep. 30, 2009.

U.S. Office Action for U.S. Appl. No. 11/980,425 dated Aug. 5, 2010.

Notice of Allowance for U.S. Appl. No. 11/980,627 dated Aug. 19, 2010.

* cited by examiner

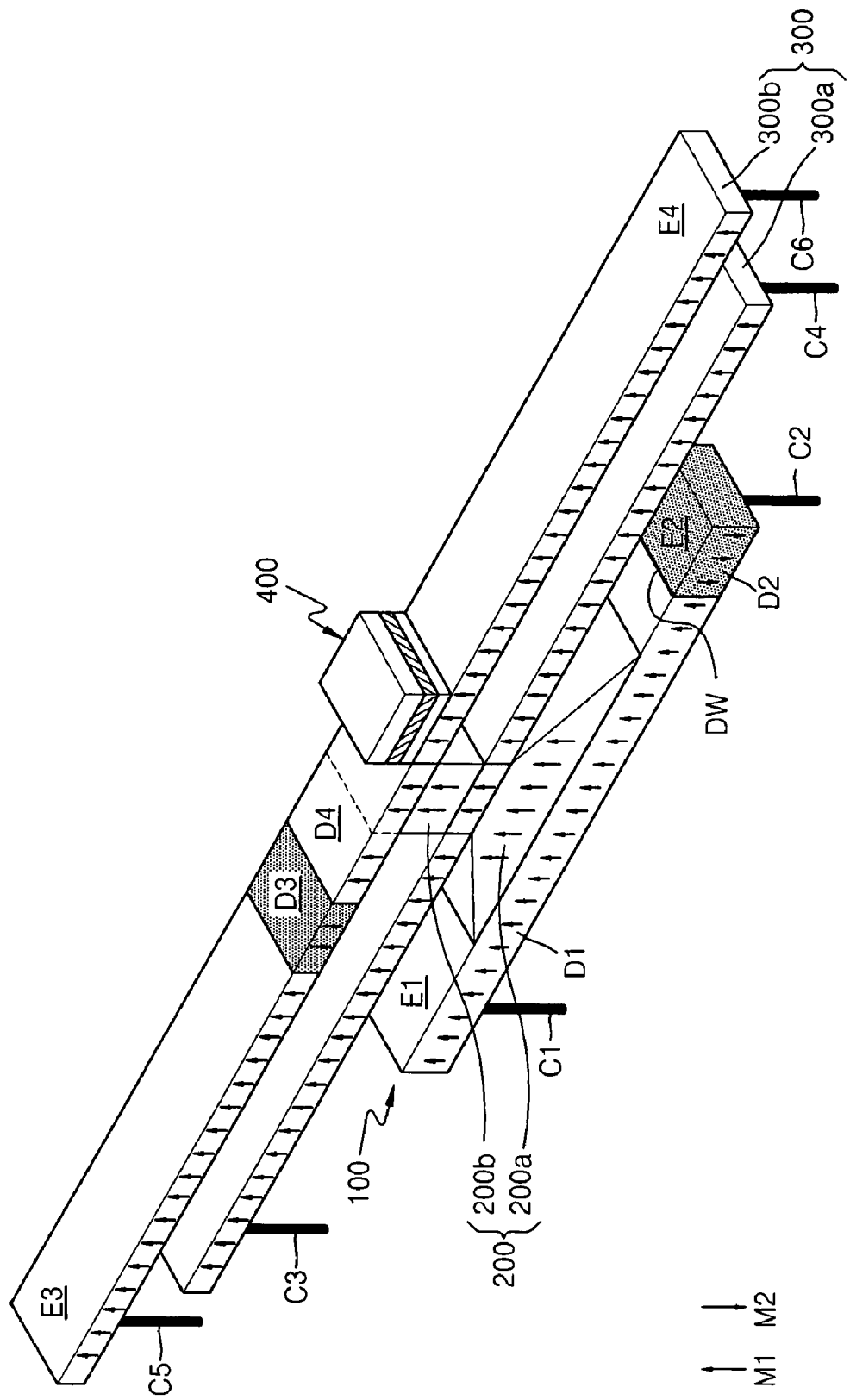

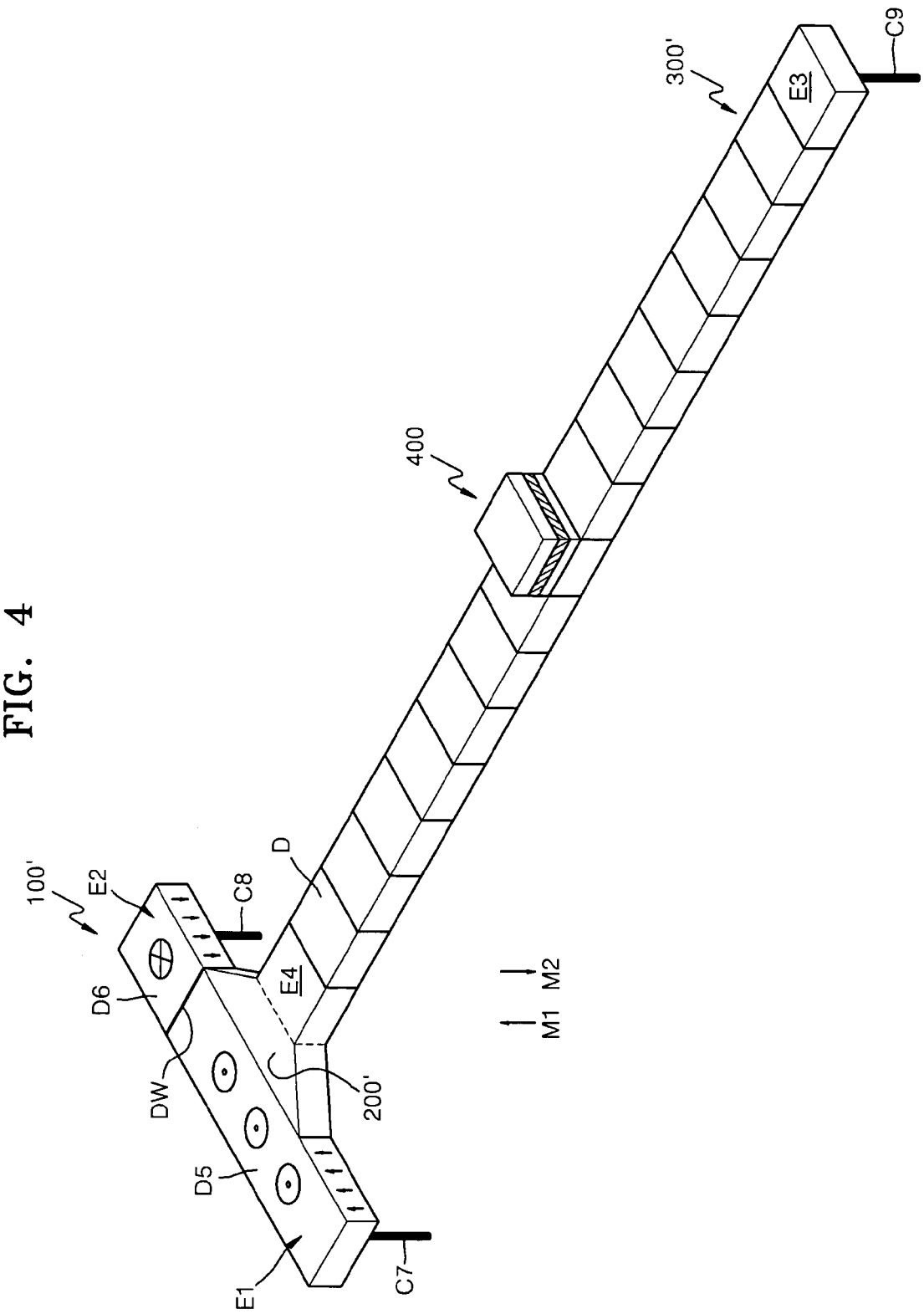

INFORMATION STORAGE DEVICES USING MAGNETIC DOMAIN WALL MOVEMENT AND METHODS OF MANUFACTURING THE SAME

PRIORITY STATEMENT

This non-provisional U.S. patent application claims priority under 35 U.S.C. §119 to Korean Patent Application No. 10-2006-0138866, filed on Dec. 29, 2006, Korean Patent Application No. 10-2006-0138862, filed on Dec. 29, 2006, and Korean Patent Application No. 10-2006-0133095, filed on Dec. 22, 2006, in the Korean Intellectual Property Office, the entire contents of all of which are incorporated herein by reference.

BACKGROUND

Description of the Related Art

A conventional hard disk drive (HDD) is a device that reads and writes information by moving a reading/writing head along a rotating disk formed of a magnetic recording medium. Conventional HDDs are non-volatile data storage devices capable of storing about 100 gigabytes (GB) of data or more. Conventional HDDs may be used as main storage devices in computers.

Conventional HDDs may include a relatively large amount of moving mechanical systems. These moving mechanical systems may cause various mechanical faults when the HDD is moved and/or affected by shock. As a result, mobility and/or reliability of the HDD may decrease. Also, these mechanical systems may increase manufacturing complexity and/or costs of conventional HDDs, increase power consumption and/or generate noise. For example, when HDD size is reduced, manufacturing complexity and/or costs may increase.

As an alternative to HDDs, storage devices capable of storing a relatively large amount of data with less or without moving mechanical systems such as those using magnetic domain wall movement may be used.

Magnetic fine regions constituting a magnetic body are referred to as magnetic domains. In these magnetic domains, all directions of the magneto-electricity, for example, the direction of all magnetic moments may be the same. The size of the magnetic domains and the direction of the magnetization may be controlled by the property, shape, size of the magnetic material and/or external energy. A magnetic domain wall is a boundary between magnetic domains having different magnetization directions. A magnetic domain wall may be moved using a current and/or a magnetic field applied to the magnetic material. In an information storage device using magnetic domain wall movement, the magnetic domains may be passed through pinned reading/writing heads by moving the magnetic domain wall to enable reading/writing without rotation of recording medium. Thus, such an information storage device may store a relatively large amount of data without moving mechanical systems used in conventional HDDs. Such a system may have improved mobility and/or reliability, may be more easily manufactured and/or may consume less power.

Conventional writing operations for writing data to a conventional information storage device using magnetic domain wall movement may be classified into a method using an external magnetic field and a method using a spin torque phenomenon of electrons. The method using the external magnetic field may not be applied when a magnetic layer has a relatively large magnetic anisotropic energy. When a soft magnetic layer such as NiFe is used as a storage medium, achieving relatively stable magnetic domain wall movement and relatively high recording density may be relatively difficult.

Using the spin torque phenomenon may be relatively difficult when the thickness of a magnetic layer, in which data is to be recorded, is about 3 nm or more. Accordingly, using the spin torque phenomenon writing operation in a storage device having a perpendicular magnetic recording-type, which requires a magnetic layer having a thickness of about 100 nm or more, may be relatively difficult.

SUMMARY

Example embodiments relate to information storage devices, for example, an information storage device using magnetic domain wall movement and a method of manufacturing the same.

Example embodiments provide a data or information storage device including a writer, which is not limited by the properties and the dimensions of an information storage magnetic layer in which data is to be recorded.

At least one example embodiment provides an information storage device using magnetic domain wall movement. In at least this example embodiment, a write track or writing magnetic layer may include a magnetic domain wall. A store track or information storing magnetic layer may be connected to the write track, and may include at least one magnetic domain wall. A reader may read data recorded in the store track. The width of a connection between the write track and the store track may decrease between the write track and the store track.

According to at least some example embodiments, an angle θ between each of at least two sidewalls of a connection portion and the write track may be $10° \leq \theta < 90°$.

According to at least some example embodiments, the write track may be a ferromagnetic layer, the connection portion may be a soft magnetic layer formed on the write track, and the store track may be formed on the connection portion. The store track may be a ferromagnetic layer. A portion of the store track contacting the connection portion may be a soft magnetic layer or a ferromagnetic layer, and a portion of the store track other than the portion of the store track contacting the connection portion may be a ferromagnetic layer.

According to at least some example embodiments, when the write track is a ferromagnetic layer, the connection portion may be a soft magnetic layer formed on the write track, and the store track may be formed on the connection portion. A mid-layer and a different store track may be alternately stacked on the store track. The mid-layer may be a soft magnetic layer, and the different store track may be a ferromagnetic layer. A portion of the different store track contacting the mid-layer may be a soft magnetic layer or a ferromagnetic layer, and a portion of the different store track other than the portion of the other store track contacting the mid-layer may be a ferromagnetic layer.

According to at least some example embodiments, the write track may be a ferromagnetic layer, the store track may be a ferromagnetic layer formed on a side of the write track, and the connection portion may be a ferromagnetic layer or a soft magnetic layer. The write track, the connection portion and the store track may be formed of the same or substantially the same material on the same layer. The storage device may include a plurality of the store tracks.

At least one other example embodiment provides a method of manufacturing an information storage device. In at least this example embodiment, a write track may be formed on a substrate. A connection layer may be formed on the write track. The connection layer may be formed to have an upper portion and a lower portion, the upper portion being narrower than the lower portion. A store track may be formed on the connection layer.

According to at least some example embodiments, the forming of the connection layer on the write track may include forming an insulating layer having an opening exposing the write track. The write track may have an upper portion that is narrower than a lower portion. The connection layer may be formed on the write track exposed by the opening. In forming of the insulating layer which has an opening that exposes the write track, a resin layer pattern may be formed on the write track. An insulating layer may be formed on the write track to cover the resin layer pattern, and a chemical mechanical polishing (CMP) may be performed on the insulating layer to expose the resin layer pattern. The resin layer pattern may be removed. The connection layer may be formed using electro plating.

According to at least some example embodiments, in forming the resin layer pattern on the write track, a resin layer may be formed on the write track, and the resin layer may be patterned by imprinting using a master stamp having a groove formed therein. A width of the groove may be narrower toward the center of the master stamp. The master stamp may be removed after patterning.

At least one other example embodiment provides an information storage device. According to at least this example embodiment, a writing magnetic layer may include at least one magnetic domain wall. At least one information storing magnetic layer may be connected to the writing magnetic layer via a connection layer. The at least one information storing magnetic layer may include at least one magnetic domain wall. A reader may read data recorded in the at least one information storing magnetic layer. The width of the connection layer may become smaller from the writing magnetic layer towards the information storing layer.

According to at least some example embodiments, a first portion of the at least one information storing magnetic layer may contact the connection layer, and the first portion may be a soft magnetic layer or a ferromagnetic layer. A part of the information storing magnetic layer other than the first portion may be a ferromagnetic layer. Alternatively, a first portion of the second information storing magnetic layer may contact the mid-layer. The first portion may be a soft magnetic layer or a ferromagnetic layer and a part of the second information storing layer other than the first portion may be a ferromagnetic layer.

At least one other example embodiment provides a method of manufacturing an information storage device. According to at least this example embodiment, a writing magnetic layer may be formed and a connection layer may be formed on the writing magnetic layer. The connection layer may become narrower in an upward direction. At least one information storing magnetic layer may be formed on the connection layer.

According to at least some example embodiments, an insulating layer having an opening exposing the writing magnetic layer may be formed. The opening may become narrower in an upward direction. The connection layer may be formed on the exposed writing magnetic layer. A resin layer pattern may be formed on the writing magnetic layer, which becomes narrower in an upward direction. An insulating layer may be formed on the writing magnetic layer to cover the resin layer pattern. Chemical mechanical polishing (CMP) may be performed on the insulating layer to expose the resin layer pattern. The resin layer pattern may be removed.

BRIEF DESCRIPTION OF THE DRAWINGS

Example embodiments will become more apparent by describing in detail the example embodiments shown in the attached drawings in which:

FIG. 2A through 2D are perspective views illustrating an example writing operation according to an example embodiment;

FIG. 4 is a perspective view illustrating an information storage device according to another example embodiment.

DETAILED DESCRIPTION OF EXAMPLE EMBODIMENTS

Figure 1:
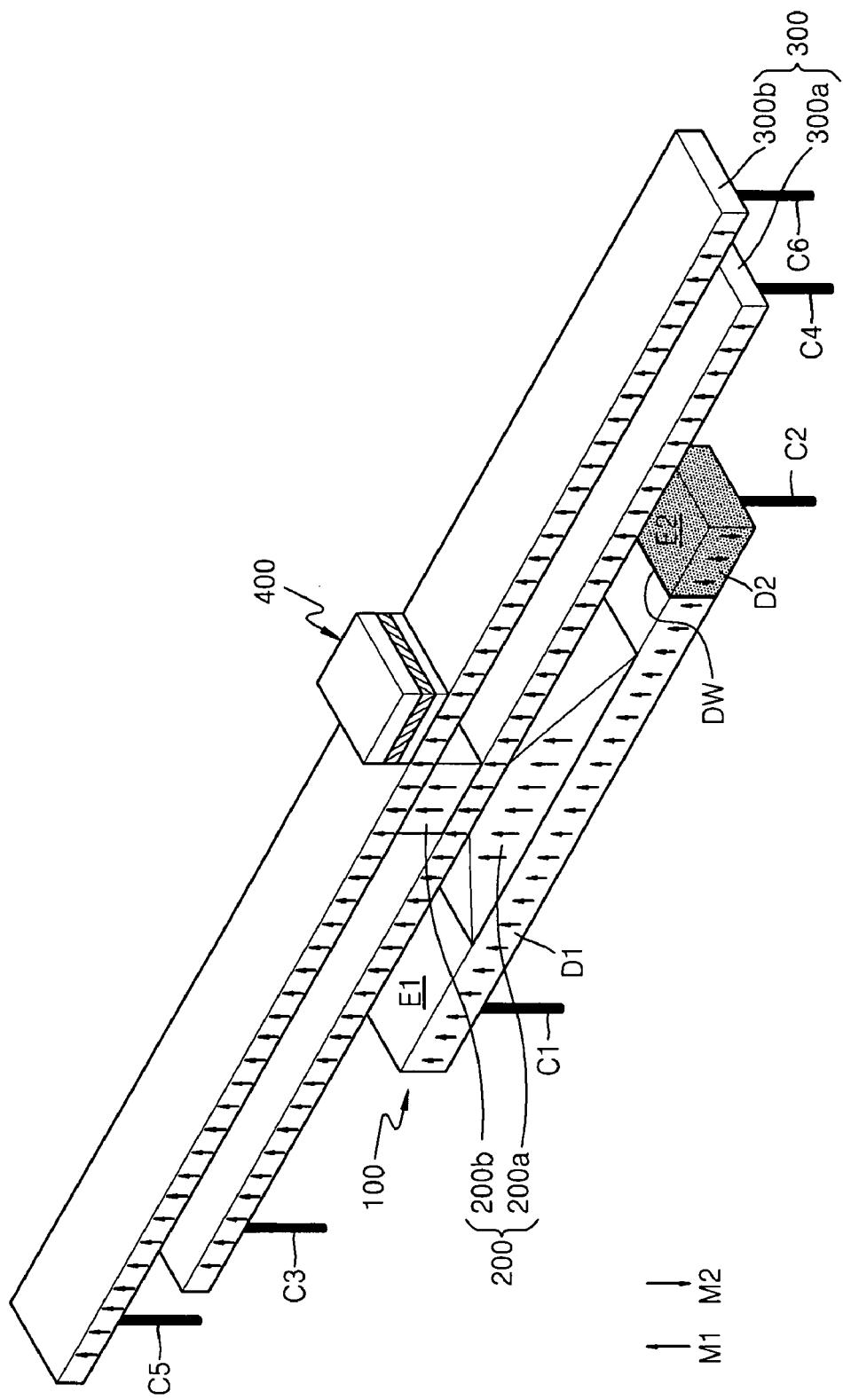
FIG. 1 is a perspective view illustrating an information storage device according to an example embodiment.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a perspective view illustrating an information storage device (hereinafter, referred to as "first information storage device") according to an example embodiment.

Referring to FIG. 1, the first information storage device may include an information storing magnetic layer or store track 300 and a writing magnetic layer or write track 100 for recording data in the information storing magnetic layer 300. Both of the writing magnetic layer 100 and the information storing magnetic layer 300 may have properties for employing magnetic domain wall movement. Although the writing magnetic layer 100 and the information storing magnetic layer 300 are shown parallel to each other in FIG. 1, the writing magnetic layer 100 and the information storing magnetic layer 300 may be perpendicular. If the writing magnetic layer 100 and the information storing magnetic layer 300 are perpendicular to each other, a plurality of information storing magnetic layers may be formed along the writing magnetic layer 100. The information storing magnetic layer 300 may include a plurality of layers stacked perpendicular to the writing magnetic layer 100. The plurality of layers in this example are denoted by first and second information storing magnetic layers 300a and 300b denoted sequentially from bottom to top. The lengths of the first and second storing magnetic layers 300a and 300b may be different. For example, the higher in a stack an information storing magnetic layer is, the longer the information storing magnetic layer may be.

A mid-layer or connecting magnetic layer 200 may be disposed between the writing magnetic layer 100 and the information storing magnetic layer 300 and between the first and second information storing magnetic layers 300a and 300b. The mid-layer 200 may be formed of a soft magnetic material. The mid-layer 200 between the writing magnetic layer 100 and the first information storing magnetic layer 300a is referred to as a first mid-layer or first connecting magnetic layer 200a. The mid-layer 200 between the first and information storing magnetic layers 300a and 300b is referred to as a second mid-layer or second connecting magnetic layer 200b. The first mid-layer 200a may be a connection layer between the writing magnetic layer 100 and the first information storing magnetic layer 300a. The first mid-layer 200a may be tapered toward the first information storing magnetic layer 300a from the writing magnetic layer 100, such that the width of the first mid-layer 200a is smaller near the first information storing magnetic layer 300a as compared with near the writing magnetic layer 100. According to at least one example embodiment, the mid-layer 200a may have a trapezoidal or other similar polygonal cross-section.

A reader 400 for reading information recorded in the information storing magnetic layer 300 may be formed in a first region of the information storing magnetic layer 300. The reader 400 may be a magnetic resistance sensor such as a tunnel magneto resistance (TMR) sensor, a giant magneto resistance (GMR) sensor or the like, which are well-known. The reader 400 may be formed below the information storing magnetic layer 300, or alternatively, on or below the writing magnetic layer 100.

First and second wires C1 and C2 may be formed on respective ends E1 and E2 of the writing magnetic layer 100. Third and fourth wires C3 and C4 may be formed on respective ends of the first information storing magnetic layer 300a. Fifth and sixth wires C5 and C6 may be formed on respective ends of the second information storing magnetic layer 300b. The first through sixth wires C1-C6 may be used to supply a current to the writing magnetic layer 100 and the information storing magnetic layer 300. Each of the wires C1-C6 may be connected to a driving device (not shown) such as a transistor or the like.

The writing magnetic layer 100 may be a ferromagnetic layer formed of CoPt, FePt, an alloy of CoPt and FePt or the like. The magnetic anisotropic energy of the writing magnetic layer 100 may be in the range of about $2 \times 10^3$ to about $10^7$ J/m$^3$, inclusive. The mid-layer 200 may be a soft magnetic layer formed of one selected from the group of Ni, Co, NiCo, NiFe, CoFe, CoZrNb, CoZrCr or the like. The magnetic anisotropic energy of the mid-layer 200 may be in the range of about 10 to about $10^3$ J/m$^3$, inclusive. The magnetic anisotropic energy of a portion of the information storing magnetic layer 300 contacting the mid-layer 200 (hereinafter, referred to as "first portion") may be less than the magnetic anisotropic energy of a portion of the information storing magnetic layer 300 not contacting the mid-layer 200 (hereinafter, referred to as "second portion"). However, alternatively, the magnetic anisotropic energy of the information storing magnetic layer 300 may be the same or substantially the same over entire area of the information storing magnetic layer 300. A magnetic anisotropic energy K1 of the first portion may satisfy $0 \leq K1 \leq 10^7$ J/m$^3$, and a magnetic anisotropic energy K2 of the second portion may satisfy $2 \times 10^3 \leq K2 \leq 10^7$ J/m$^3$. The information storing magnetic layer 300 may be comprised of CoPt, FePt, an alloy of CoPt and FePt or the like. The first portion of the information storing magnetic layer 300 may be doped with impurity ions such as He$^+$, Ga$^+$ or the like. Because the first portion may be doped with impurity ions, the magnetic anisotropic energy of the first portion may be lower than that of the second portion.

The writing magnetic layer 100 may include at least two magnetic domains and at least one magnetic domain wall. FIG. 1 illustrates a case in which the writing magnetic layer 100 may include first and second magnetic domains D1 and D2, with a magnetic domain wall DW located there between. The first and second magnetic domains D1 and D2 may be formed in the writing magnetic layer 100 using various methods. For example, a soft magnetic layer may be formed on one end of a ferromagnetic layer, which may be used as the writing magnetic layer 100, and an external magnetic field may be supplied to the ferromagnetic layer and the soft magnetic layer. When an external magnetic field is supplied to the ferromagnetic layer and the soft magnetic layer, the portion of the ferromagnetic layer contacting the soft magnetic layer may have a magnetization direction different from that of other parts of the ferromagnetic layer. Furthermore, the first and second magnetic domains D1 and D2 may be formed using any suitable method.

FIG. 1 illustrates a case in which the first magnetic domain D1, the mid-layer 200 and the information storing magnetic layer 300 are magnetized in a first direction M1, and the second magnetic domain D2 is magnetized in a second direction M2. The magnetic domain wall DW may be moved in the writing magnetic layer 100 by supplying a current between the ends E1 and E2 of the writing magnetic layer 100. Because the directions of current flow and electron flow are opposite, and the magnetic domain wall DW may move in the same direction as the electrons, the magnetic domain wall DW may move in a direction opposite to the current flow direction. For example, when a current is supplied from the first wire C1 to the second wire C2, the magnetic domain wall DW may move towards the first wire C1. The magnetization of the first mid-layer 200a may vary according to the location of the magnetic domain wall DW. For example, the magnetization direction of the first mid-layer 200a may conform to the magnetization direction of the writing magnetic layer 100 contacting the first mid-layer 200a because the mid-layer 200 is a soft magnetic layer in which magnetization reversal is easier.

When the magnetization direction of the first mid-layer 200a is reversed, the magnetization direction of a portion of the first information storing magnetic layer 300a contacting the first mid-layer 200a (e.g., the first portion) may be the same as the magnetization direction of the first mid-layer 200a. The first mid-layer 200a and the first portion of the first information storing magnetic layer 300a having the same magnetization direction may be more stable than the reverse case in terms of energy. Such magnetization reversal may occur serially from a bottom layer of the mid-layer 200 (e.g., the first mid-layer 200a) to the first portion of the second information storing magnetic layer 300b contacting the second mid-layer 200b. When the magnetic anisotropic energy K1 of the first portion is less than the magnetic anisotropic energy K2 of the second portion, magnetization reversal may occur more easily in the first portion.

The magnetization direction of the first portion may be reversed to a desired state, and the magnetic domain formed into the desired state may be moved from the first portion into the second portion by one magnetic domain unit. Thus, information may be stored in the second portion and further data may continue to be stored.

Hereinafter, a writing operation of the first information storage device according to an example embodiment will be described with regard to FIGS. 2A-2D.

FIGS. 2A through 2D are perspective views illustrating an example writing operation of the first information storage device according to an example embodiment.

Figure 2A:
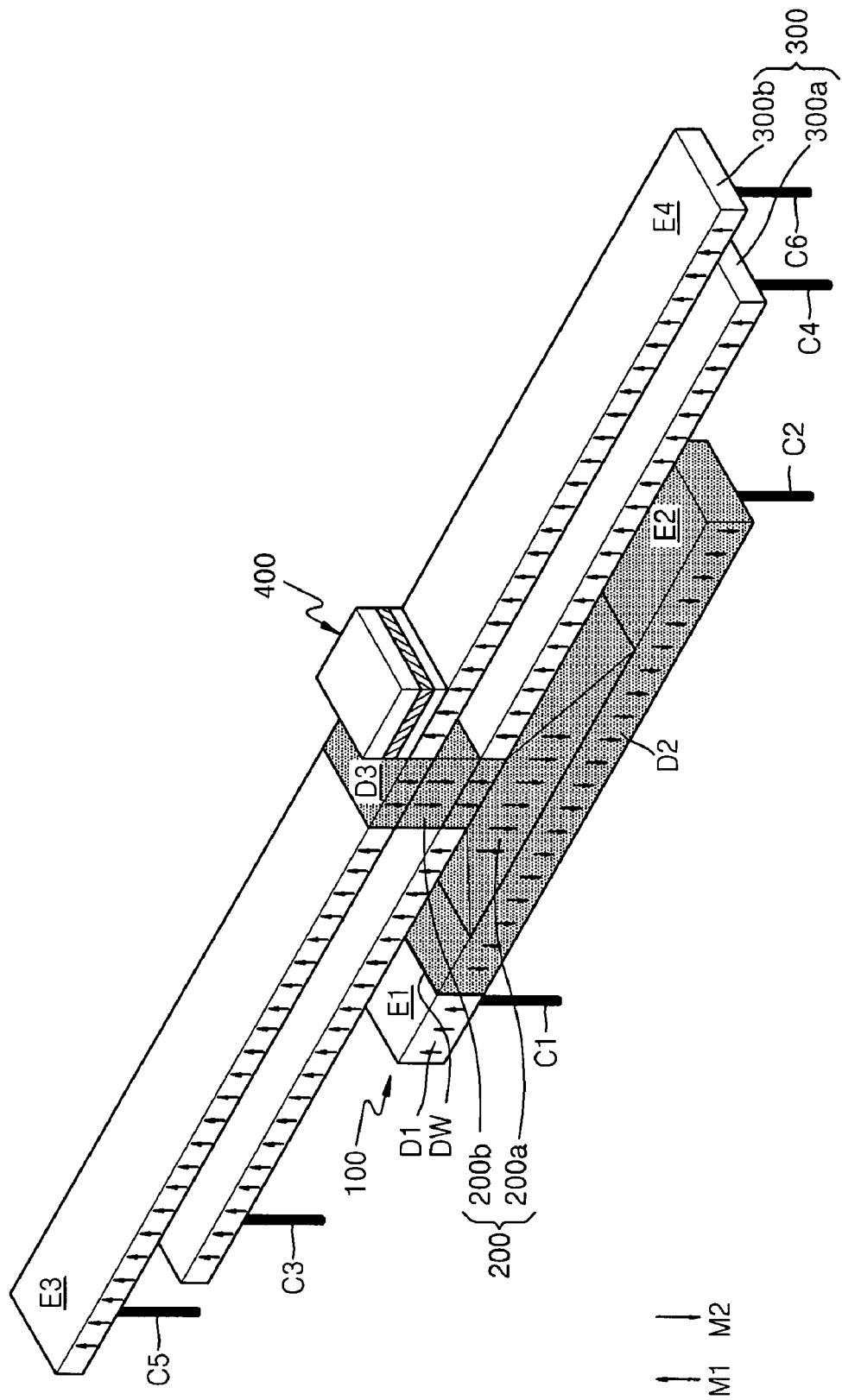

FIG. 2A is a perspective view illustrating a result of moving the magnetic domain wall DW of the information storage device of FIG. 1. A current may be supplied from one end E1 to the other end E2 of a writing magnetic layer 100 to move the magnetic domain wall DW from the end E2 to the end E1. As a result, the second magnetic domain D2 may expand to be below the first mid-layer 200a. According to the movement of the magnetic domain wall DW, a magnetization direction from the first mid-layer 200a to the first portion of the second information storing magnetic layer 300b may be reversed to a second direction M2. As a result, another magnetic domain (hereinafter, referred to as "the third magnetic domain") D3 may be formed in the information storing magnetic layer 300. Data corresponding to the third magnetic domain D3 may be '0'. Reference numerals E3 and E4 denote respective ends of the second information storing magnetic layer 300b.

Figure 2B:
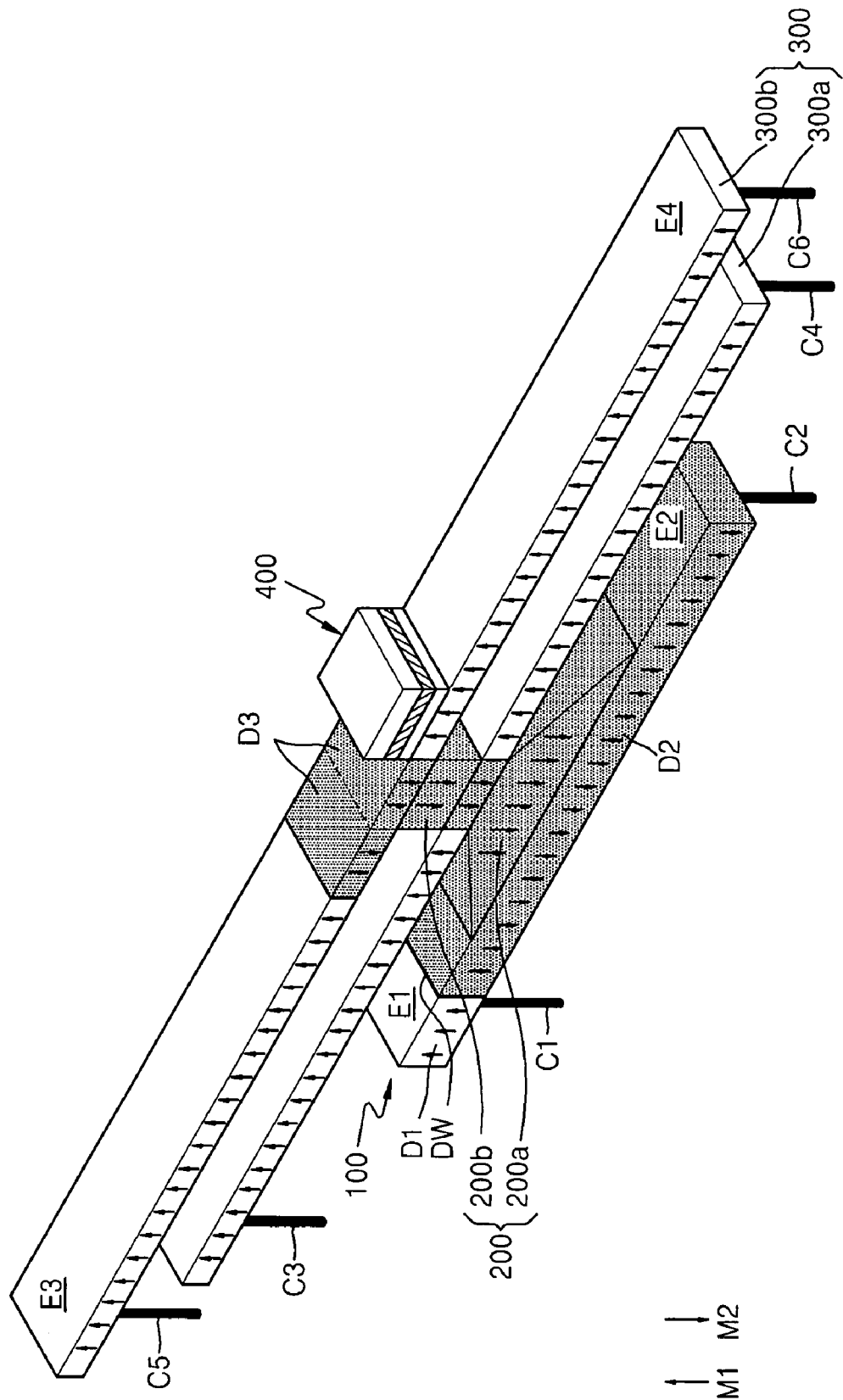

Referring to FIG. 2B, a current may be supplied from the end E3 of the second information storing magnetic layer 300b to the writing magnetic layer 100, and the third magnetic domain D3 may expand towards the end E3 of the second information storing magnetic layer 300b by one magnetic domain unit.

Figure 2C:
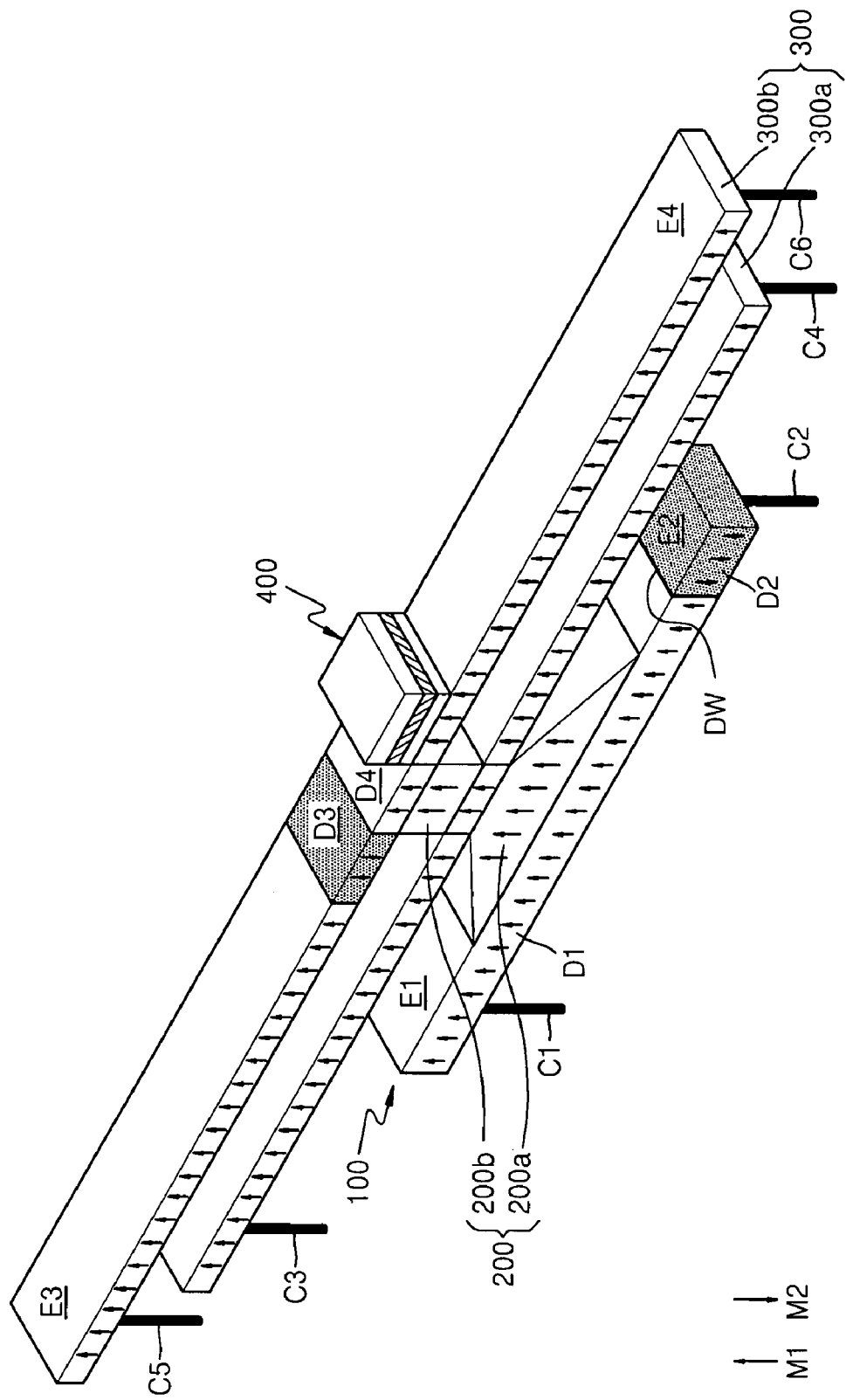

Referring to FIG. 2C, a current may be supplied from the end E2 to the end E1 of the writing magnetic layer 100, and the magnetic domain wall DW may move from the end E1 to the end E2. Accordingly, the second magnetic domain D1 may expand to be below the first mid-layer 200a. According to a movement of the magnetic domain wall DW, the magnetization direction from the first mid-layer 200a to the first portion of the second information storing magnetic layer 300b may be reversed to a first direction M1. A magnetic domain formed in a portion of the second information storing magnetic layer 300b contacting the second mid-layer 200b is referred to herein as a fourth magnetic domain D4. Data corresponding to the fourth magnetic domain D4 may be '1'.

Referring to FIG. 2D, a current may be supplied from the end E3 of the second information storing magnetic layer 300b, to the writing magnetic layer 100 to move the third and fourth magnetic domains D3 and D4 toward the end E3 of the second information storing magnetic layer 300b by one magnetic domain unit.

In at least one example embodiment of the first information storage device, binary data may be recorded in the information storing magnetic layer 300 by moving magnetic domain walls in the writing magnetic layer 100 and the information storing magnetic layer 300. This writing operation using such magnetic domain wall movement may be performed by controlling the flow of current. Accordingly, example writing operations of the information storage device according to at least this example embodiment may not be limited by the properties and/or the dimensions of a magnetic layer in which data is to be recorded.

For example, in the first information storage device, the closer the first mid-layer 200a is to the information storing magnetic layer 300, the smaller the width of the first mid-layer 200a. For example, two or four sidewalls of the first mid-layer 200a may form angles less than about 90°, preferably, between about 10° to about 60°, inclusive, with respect to the writing magnetic layer 100. The two sidewalls may be two sidewalls of the first mid-layer 200a, which do not share an edge, of the four sidewalls of the first mid-layer 200a.

Because of the shape of the first mid-layer 200a, the magnetic domain wall DW may be moved more smoothly in the writing magnetic layer 100. If the four sidewalls of the first mid-layer 200a are each perpendicular to the writing magnetic layer 100, moving the magnetic domain wall DW relatively smoothly through a junction between the first mid-layer 200a and the writing magnetic layer 100 may be more difficult. This is because if the sidewalls of the first mid-layer 200a are each perpendicular to the writing magnetic layer 100, a current density for moving the magnetic domain wall DW may decrease in both end parts of the junction. Accordingly, the magnetic domain wall DW may not move smoothly through the junction and a relatively large current may be required for moving the magnetic domain wall DW through the junction. On the other hand, when the sidewall of the first mid-layer 200a is inclined with respect to the writing magnetic layer 100, a current density may be changed (e.g., gradually changed) in the junction between the first mid-layer 200a and the writing magnetic layer 100. Accordingly, the magnetic domain wall DW may move more smoothly in the writing magnetic layer 100.

Hereinafter, a method of manufacturing an information storage device according to an example embodiment (hereinafter, referred to as "manufacturing method of the present invention") will be described with regard to FIGS. 3A-3K.

FIGS. 3A through 3K are cross-sectional views illustrating a method of manufacturing an information storage device according to an example embodiment.

Figure 3A:
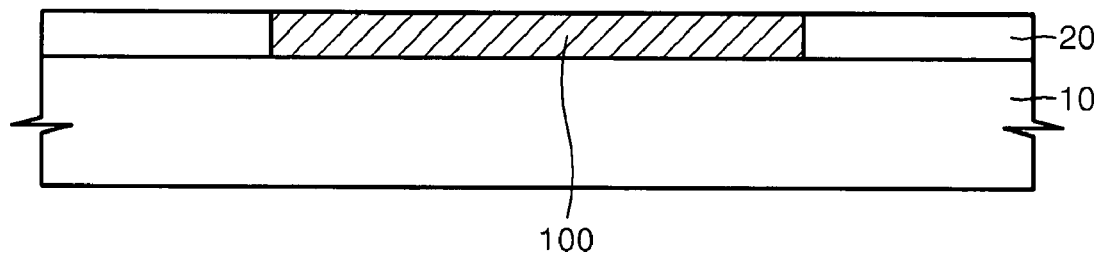
FIGS. 3A through 3K are cross-sectional views illustrating a method of manufacturing an information storage device according to an example embodiment.

Referring to FIG. 3A, a writing magnetic layer 100 may be formed on a substrate 10. A first insulating layer 20 may be formed on the substrate 10 to cover the writing magnetic layer 100. Chemical mechanical polishing (CMP) may be performed on the first insulating layer 20 to expose the writing magnetic layer 100.

Figure 3B:
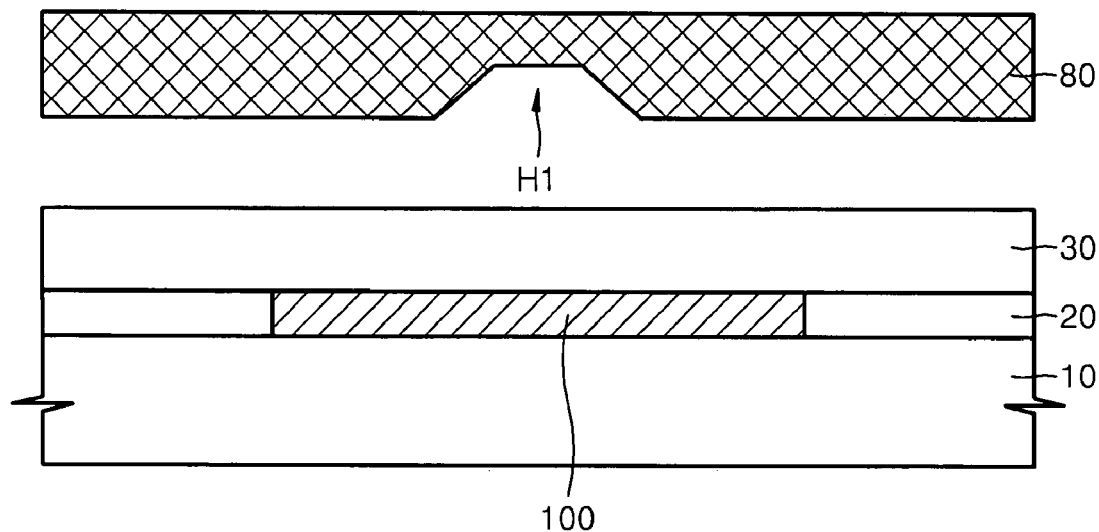

Referring to FIG. 3B, a resin layer 30 may be formed on the writing magnetic layer 100 and the first insulating layer 20. A first master stamp 80 having a first groove H1 may be aligned above the resin layer 30. The width of the first groove H1 may decrease toward the center of the first master stamp 80. For example, the first groove H1 may have sidewalls inclined relative to the plane of the first master stamp 80. The first master stamp 80 may be fabricated using a nano-patterning method such as an electron (E)-beam lithography or the like. An angle of inclination of a sidewall of the first groove H1 may be different or changed according to etching conditions when fabricating the first master stamp 80. The first master stamp 80 may be used repeatedly.

Figure 3C:
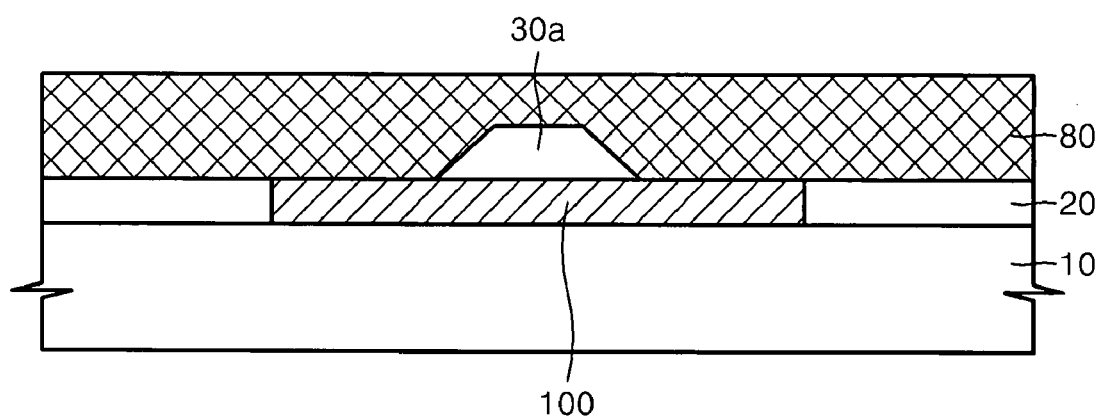
Figure 3D:
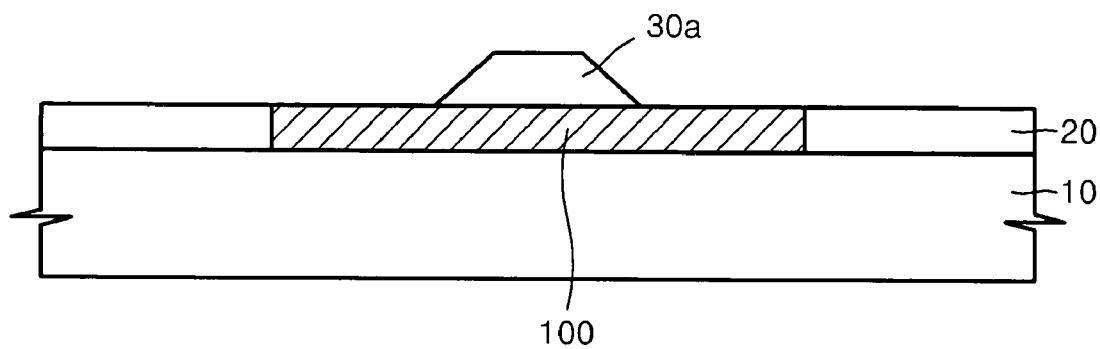

Referring to FIG. 3C, the resin layer 30 may be patterned by imprinting the resin layer 30 using the first master stamp 80. Accordingly, a resin layer pattern 30a may be formed on the writing magnetic layer 100. The first master stamp 80 may be removed from the resin layer pattern 30a, the writing magnetic layer 100 and the first insulating layer 20. FIG. 3D illustrates a result of removing the first master stamp 80.

Referring to FIG. 3D, the resin layer pattern 30a may be formed on the writing magnetic layer 100 using an imprint process with the first master stamp 80, as discussed above. A portion of the resin layer 30 may remain in a region other than a region on which the resin layer pattern 30a is formed. Such a remaining resin layer may be removed using reactive ion etching (RIE), plasma ashing or the like. When the remaining resin layer is removed, a portion of the resin layer pattern 30a may also be removed, but the shape of the resin layer pattern 30a may remain the same or substantially the same. Because the shape of the resin layer pattern 30a corresponds to that of the first groove H1, the width of the resin layer pattern 30a may decrease in an upward direction. For example, a width of the bottom portion of the resin layer 30a may be larger than a width of the top portion of the resin layer 30a. In at least one example embodiment, the resin layer may have a trapezoidal shape.

Figure 3E:
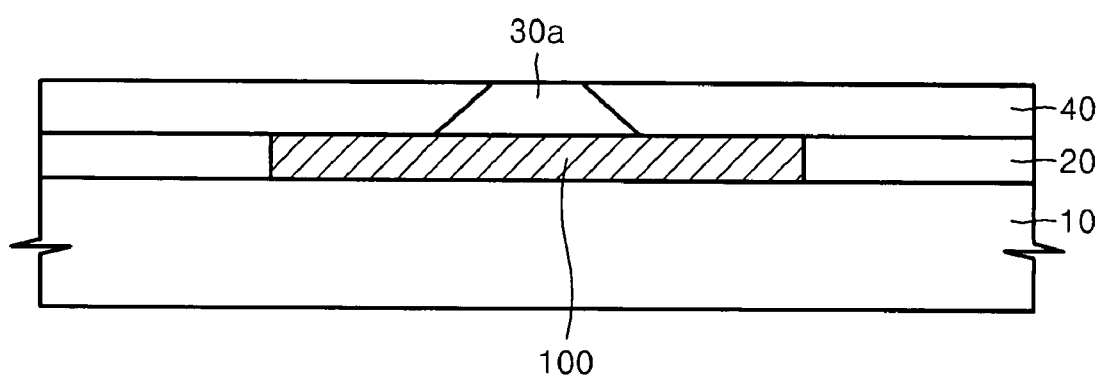

Referring to FIG. 3E, a second insulating layer 40 may be formed on the writing magnetic layer 100 and the first insulating layer 20 to cover the resin layer pattern 30a. CMP may be performed on the second insulating layer 40 to expose the resin layer pattern 30a. The second insulating layer 40 may be a silicon oxide layer or the like.

Figure 3F:
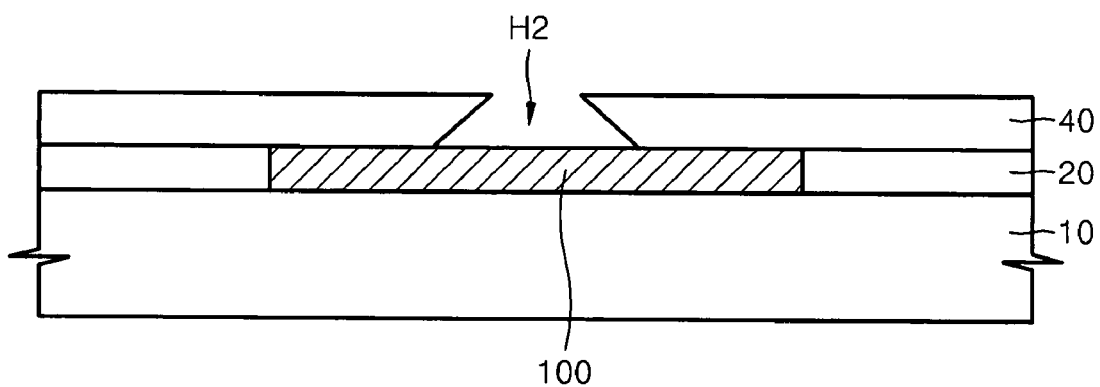

Referring to FIG. 3F, the resin layer pattern 30a may be removed using wet and/or dry etching. Accordingly, a second groove H2 may be formed, exposing the writing magnetic layer 100. Due to an etching selectivity difference between the resin layer pattern 30a and the second insulating layer 40, the resin layer pattern 30a may be selectively removed. As shown, the shape of the second groove H2 may be complementary to the shape of the resin layer 30a.

Figure 3G:
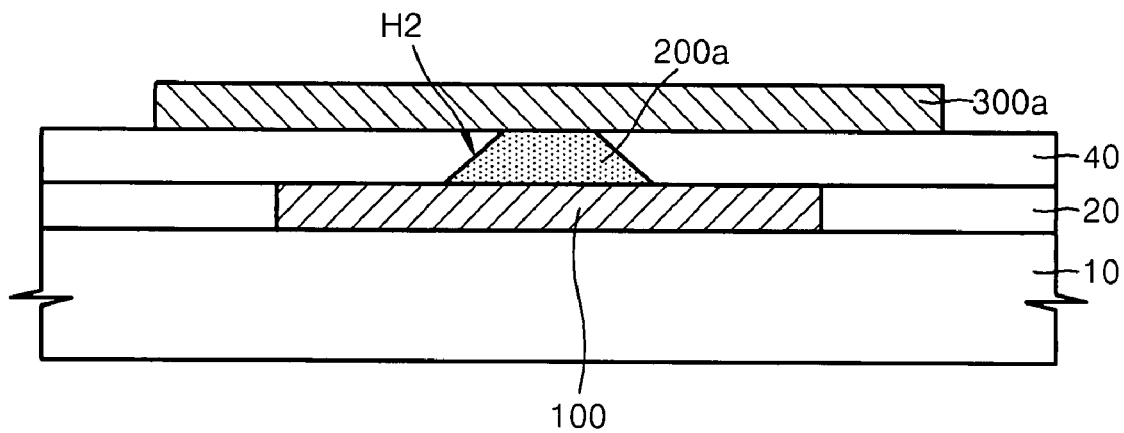

Referring to FIG. 3G, a first mid-layer 200a may be formed in the second groove H2 using an electro plating. The thickness of the first mid-layer 200a may be controlled by adjusting reaction conditions and/or reaction time of the electro plating. Accordingly, the height of the first mid-layer 200a and the height of the second groove H2 may correspond to each other. A first information storing magnetic layer 300a may be formed on the first mid-layer 200a and the second insulating layer 40.

Figure 3H:
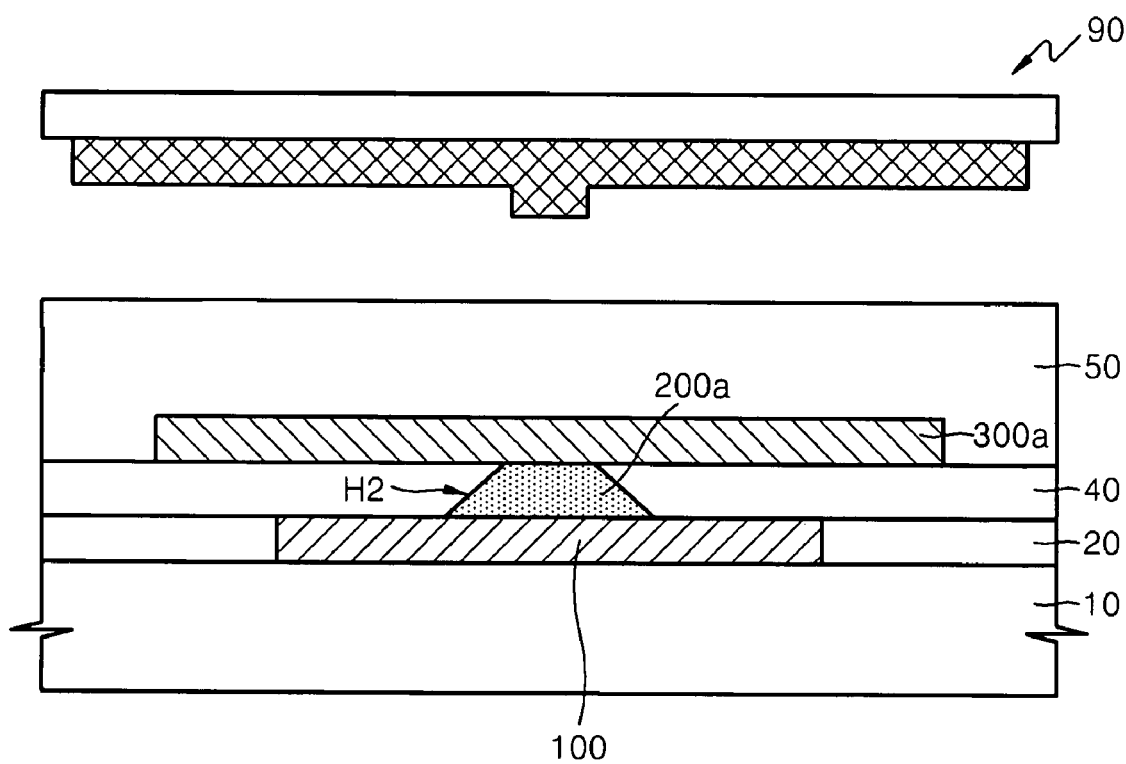

Referring to FIG. 3H, another resin layer (hereinafter, referred to as "the second resin layer") 50 may be formed on the second insulating layer 40 to cover the first information storing magnetic layer 300a.

A second master stamp 90 having a multi-step structure may be aligned above the second resin layer 50. The second master stamp 90 may be fabricated using a nano-patterning method such as ah %-beam, lithography or the like, and may be used repeatedly.

Figure 3I:
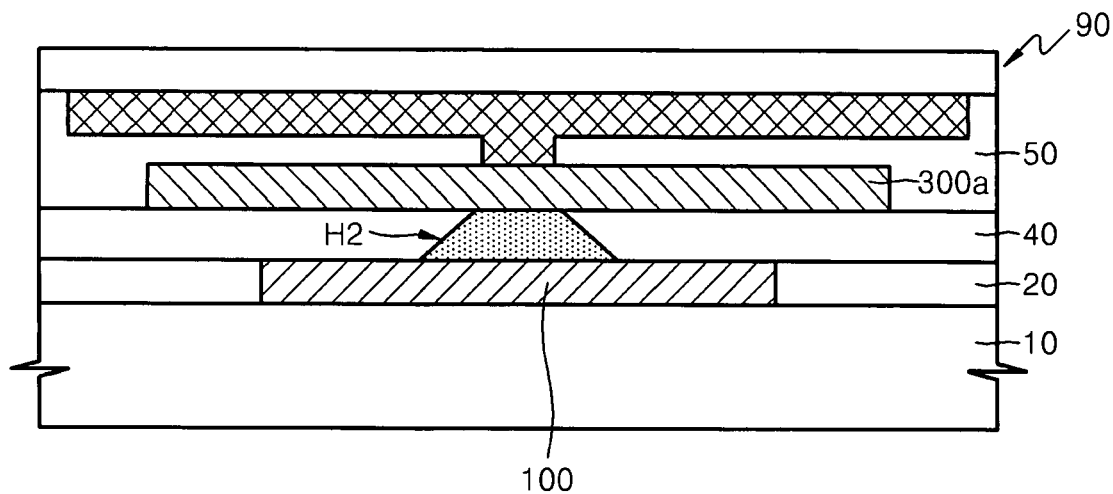
Figure 3J:
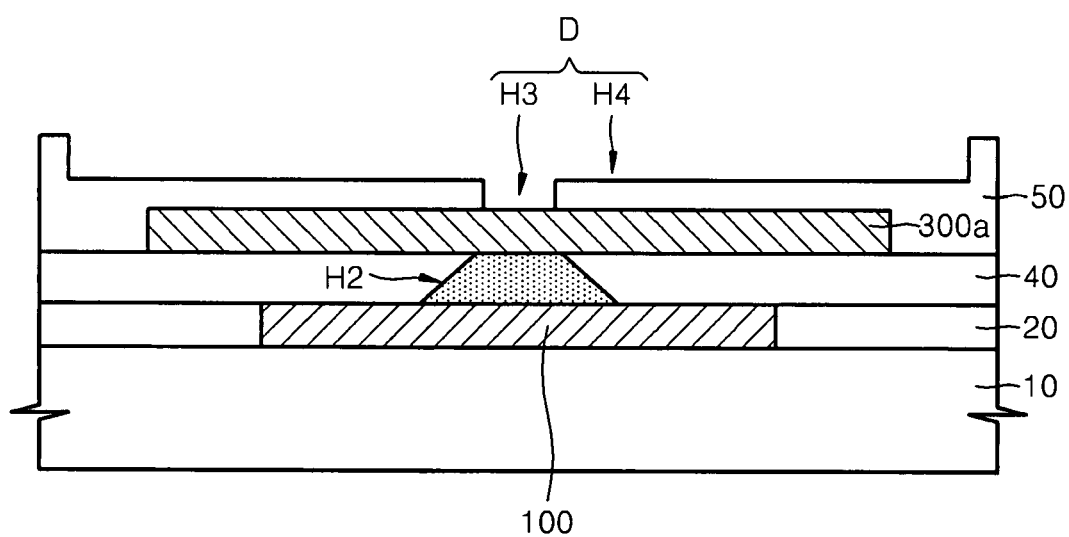

Referring to FIG. 3I, a second resin layer 50 may be patterned by imprinting the second resin layer 50 using the second master stamp 90. The second master stamp 90 may be removed from the second resin layer 50. FIG. 3J illustrates a result of patterning the second resin layer 50.

Referring to FIG. 3J, a double-groove D may be formed using the imprint process with the second master stamp 90 so that the first information storing magnetic layer 300a may be exposed. The double-groove D may include a third groove H3 in a central or center portion and a fourth groove H4. The fourth groove H4 may be wider than the third groove H3 and formed above the third groove H3. A part of the second resin layer 50 may remain on a bottom of the third groove H3. Any undesirable portions of the remaining second resin layer may be removed using RIE, plasma ashing or the like.

The first information storing magnetic layer 300a exposed by the double-groove D may be doped with impurity ions such as $He^+$, $Ga^+$ or the like using the second resin layer 50 including the double-groove D as an ion injection mask. When a magnetic material is doped with impurity ions such as $He^+$ or $Ga^+$, the magnetic anisotropic energy of the magnetic material may decrease. This is because the impurity ion may deteriorate a magnetic coupling effect between magnetic particles constituting the magnetic material. According to at least some example embodiments, doping may be optional.

Figure 3K:
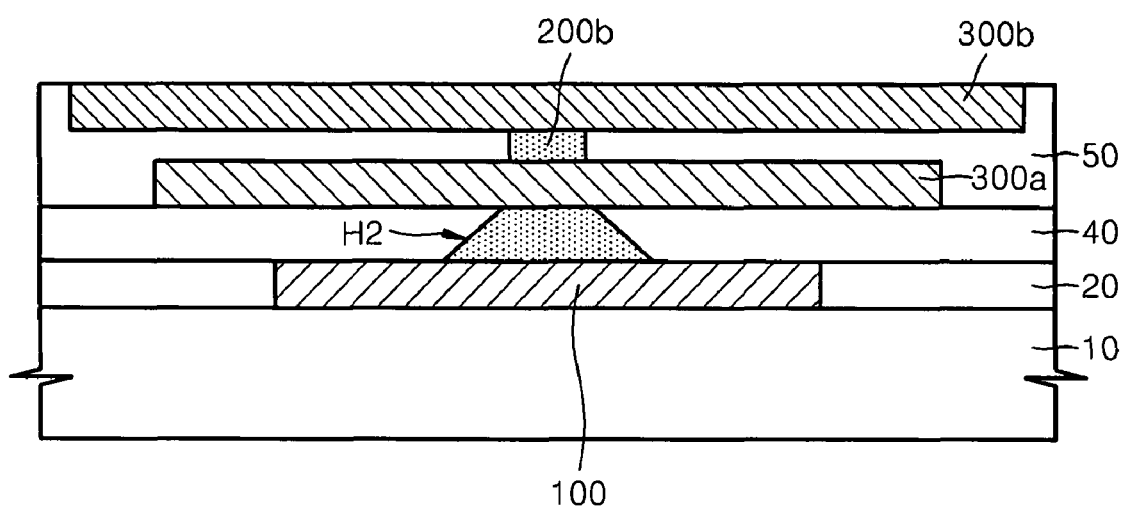

Referring to FIG. 3K, a second mid-layer 200b may be formed in the third groove H3 using electro plating. A second information storing magnetic layer 300b may be formed in the fourth groove H4. The second information storing magnetic layer 300b may be formed using a method in which a magnetic layer is deposited on the second resin layer 50 having the fourth groove H4 and the second mid-layer 200b may be formed using a sputtering method or the like. CMP may be performed on the second information storing magnetic layer 300b.

Although not illustrated, other mid-layers and other information storing magnetic layers or store tracks may be stacked repeatedly on the second information storing magnetic layer 300b. In manufacturing methods according to example embodiments, a reader (e.g., a magnetic resistance sensor such as one using TMR or GMR effects) may be formed on a first region of the information storing magnetic layer 300 or the writing magnetic layer 100.

In manufacturing methods according to example embodiments, two grooves may be formed using one imprinting process with a multi-step master stamp. Accordingly, an information storage device having a larger capacity may be realized using less method processing.

Information storage devices according to example embodiments may be altered in various ways. For example, information storage devices according to example embodiments may have the structure shown in FIG. 4.

FIG. 4 is a perspective view illustrating an information storage device (hereinafter, referred to as "second information storage device") according to an example embodiment.

Referring to FIG. 4, the second information storage device may include a writing magnetic layer 100' and information storing magnetic layers or store tracks 300'. The information storing magnetic layers 300' may be formed to be connected to a side surface of the writing magnetic layer 100'. A plurality of information storing magnetic layers 300' may be formed on one side surface of the writing magnetic layer 100'. The writing magnetic layer 100' and the information storing magnetic layers 300' may be ferromagnetic layers having magnetic domain wall movement properties. A mid-layer or connecting magnetic layer 200' connecting the writing magnetic layer 100' and the information storing magnetic layers 300' may be formed there between. The width of the mid-layer 200' may decrease from the writing magnetic layer 100' to the information storing magnetic layers 300'. For example, the mid-layer 200' may have a trapezoidal or similarly shaped cross-section. Due to such shape of the mid-layer 200', a magnetic domain wall DW may be moved in the writing magnetic layer 100' more smoothly.

The writing magnetic layer 100', the mid-layer 200' and the information storing magnetic layers 300' may be formed of the same or substantially the same material on the same layer. The mid-layer 200' may be a ferromagnetic layer or a soft magnetic layer.

The writing magnetic layer 100' may include two magnetic domain walls magnetized in directions opposite to each other, for example, fifth and sixth magnetic domains D5 and D6. A mark ⊙ indicates magnetization in a first direction 'M1', and a mark ⊗ indicates magnetization in a second direction 'M2' opposite to the first direction 'M1'. A reference numeral 'D' indicates a magnetic domain in the information storing magnetic layers 300'.

Seventh and eighth wires C7 and C8 may be formed on respective ends E1 and E2 of the writing magnetic layer 100', and a ninth wire C9 may be formed on one end E3 of the information storing magnetic layers 300'. When a current is supplied to the writing magnetic layer 100' through the seventh and eighth wires C7 and C8, a magnetic domain wall DW may be moved. The magnetic domain wall DW may be a boundary between the fifth and sixth magnetic domains D5 and D6. The sizes of the fifth and sixth magnetic domains D5 and D6 may be different or change according to a movement of the magnetic domain wall DW. As illustrated in FIG. 4, when the fifth magnetic domain D5 expands to a portion of the writing magnetic layer 100' contacting the information storing magnetic layers 300', a current may be supplied from the end E3 of the information storing magnetic layers 300' to end E1 of the writing magnetic layer 100' to expand the fifth magnetic domain D5 to the end E4 of the information storing magnetic layers 300'. Data corresponding to the first direction M1, for example, may be recorded in end E4 of the information storing magnetic layers 300'.

When the sixth magnetic domain D6 expands to a portion of the writing magnetic layer 100' contacting the information storing magnetic layers 300', a current may be supplied from the end E3 of the information storing magnetic layers 300' to the end E2 of the writing magnetic layer 100' to expand the sixth magnetic domain D6 to the end E4 of the information storing magnetic layers 300'. Data corresponding to the second direction M2, for example, '1' may be recorded in the other end of the store tracks 300'.

In second information storage devices according to example embodiments, a magnetic domain and/or a magnetic domain wall may be moved in the writing magnetic layer 100' and the information storing magnetic layers 300' by one bit to record data in the information storing magnetic layers 300'.

A reader 400 for reading data recorded in the information storing magnetic layers 300' may be formed in a region of the information storing magnetic layers 300'. The reader 400 may be a magnetic resistance sensor. A read current may be supplied between the end E3 of the information storing magnetic layers 300' and the reader 400. According to the magnetization direction of the information storing magnetic layers 300' disposed below the reader 400, an electric resistance may be different between the end E3 of the information storing magnetic layers 300' and the reader 400.

Example embodiments may be similarly applied in the case where the writing magnetic layers 100 and 100' and the information storing magnetic layers 300 and 300' do not have perpendicular magnetic anisotropy, but instead have horizontal magnetic anisotropy.

As described above, according to example embodiments, magnetic domain walls may be moved in the writing magnetic layers 100 and 100' and/or the information storing magnetic layers 300 and 300' to record data in the information storing magnetic layers 300 and 300'. Such writing operations are not limited by the property and/or dimension of magnetic layer in which data is to be recorded.

For example, in the information storage devices according to example embodiments, because the width of a connection layer between the writing magnetic layers 100 and 100' and the information storing magnetic layers 300 and 300' (e.g., the width of the mid-layer 200a or 200') decreases from the writing magnetic layers 100 and 100' to the information storing magnetic layers 300 and 300', a magnetic domain wall may be moved in the writing magnetic layers 100 and 100' more smoothly. According to example embodiments, information storage devices using magnetic domain movement may have improved reliability in a writing operation, and/or a current required for the writing operation may be reduced.

While the present invention has been particularly shown, it will be understood by those of ordinary skill in the art that the above descriptions are example embodiments. For example, it will be understood by those of ordinary skill in the art that various changes in the structure of the write tracks 100 and 100', the mid-layers 200 and 200' and the store tracks 300 and 300' and the location relation there between may be made. While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An information storage device comprising:
   a writing magnetic layer including at least one magnetic domain wall;
   at least one information storing magnetic layer connected to the writing magnetic layer via a connection layer, the at least one information storing magnetic layer including at least one magnetic domain wall; and
   a reader for reading data recorded in the at least one information storing magnetic layer;

wherein the width of the connection layer becomes smaller from the writing magnetic layer towards the information storing layer.

2. The information storage device of claim 1, wherein an angle θ between each of at least two sidewalls of the connection layer and the writing magnetic layer satisfies $10° \leq \theta \leq 90°$.

3. The information storage device of claim 1, wherein the writing magnetic layer is a ferromagnetic layer.

4. The information storage device of claim 1, wherein the connection layer is a soft magnetic layer arranged on the writing magnetic layer.

5. The information storage device of claim 4, wherein the at least one information storing magnetic layer is arranged on the connection layer.

6. The information storage device of claim 1, wherein the at least one information storing magnetic layer is a ferromagnetic layer.

7. The information storage device of claim 1, wherein a first portion of the at least one information storing magnetic layer contacts the connection layer, the first portion being a soft magnetic layer or a ferromagnetic layer and a part of the information storing magnetic layer other than the first portion is a ferromagnetic layer.

8. The information storage device of claim 1, wherein the at least one information storing magnetic layer includes a first information storing magnetic layer and a second information storing magnetic layer, the first and second information storing magnetic layers being connected via a mid-layer, and being different.

9. The information storage device of claim 8, wherein the first information storing magnetic layer and the second information storing magnetic layer have different lengths.

10. The information storage device of claim 8, wherein the mid-layer is a soft magnetic layer.

11. The information storage device of claim 8, wherein at least one of the first and second information storing magnetic layers is a ferromagnetic layer.

12. The information storage device of claim 8, wherein a first portion of the second information storing magnetic layer contacts the mid-layer, the first portion being a soft magnetic layer or a ferromagnetic layer and a part of the second information storing layer other than the first portion is a ferromagnetic layer.

13. The information storage device of claim 1, wherein the at least one information storing magnetic layer is connected to a side portion of the writing magnetic layer via the connection layer.

14. The information storage device of claim 13, wherein the writing magnetic layer is a ferromagnetic layer, the at least one information storing magnetic layer is a ferromagnetic layer and the connection layer is one of a ferromagnetic layer and a soft magnetic layer.

15. The information storage device of claim 13, wherein the at least one information storing magnetic layer includes a plurality of the information storing magnetic layers.

16. The information storage device of claim 13, wherein the writing magnetic layer, the connection layer and the at least one information storing magnetic layer are formed of the same material.

* * * * *